(12) United States Patent
Jingu et al.

(10) Patent No.: US 12,013,433 B2
(45) Date of Patent: Jun. 18, 2024

(54) HEATER SUBSTRATE, PROBE CARD SUBSTRATE, AND PROBE CARD

(71) Applicant: KYOCERA Corporation, Kyoto (JP)

(72) Inventors: Daisuke Jingu, Kyoto (JP); Hidenori Tanaka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 121 days.

(21) Appl. No.: 17/799,698

(22) PCT Filed: Feb. 9, 2021

(86) PCT No.: PCT/JP2021/004702
§ 371 (c)(1),
(2) Date: Aug. 15, 2022

(87) PCT Pub. No.: WO2021/166732
PCT Pub. Date: Aug. 26, 2021

(65) Prior Publication Data
US 2023/0084616 A1 Mar. 16, 2023

(30) Foreign Application Priority Data
Feb. 18, 2020 (JP) .................... 2020-024821

(51) Int. Cl.
*G01R 31/28* (2006.01)
*G01R 1/073* (2006.01)
(Continued)

(52) U.S. Cl.
CPC ...... *G01R 31/2891* (2013.01); *G01R 1/07342* (2013.01); *G01R 31/2889* (2013.01);
(Continued)

(58) Field of Classification Search
CPC ............ G01R 31/2891; G01R 1/07342; G01R 31/2889; G01R 31/2875; H05B 1/0233;
(Continued)

(56) References Cited

U.S. PATENT DOCUMENTS

| | | | | |
|---|---|---|---|---|
| 2002/0185488 A1* | 12/2002 | Natsuhara | ............... | H05B 3/283 219/468.1 |
| 2003/0042247 A1* | 3/2003 | Ito | .......................... | H05B 3/283 219/465.1 |

(Continued)

FOREIGN PATENT DOCUMENTS

JP 2000-228270 A 8/2000

*Primary Examiner* — Alvaro E Fortich
(74) *Attorney, Agent, or Firm* — Volpe Koenig

(57) ABSTRACT

A heater substrate has an insulating substrate having a first surface and a second surface on the opposite side relative to the first surface and at least one heating element of spiral shape including plural heater wire pieces and positioned in or on the insulating substrate. The heating element of spiral shape has at least one adjustment section including a turn of all or some of the plural heater wire pieces. The plural heater wire pieces include a first heater wire piece and a second heater wire piece adjacent to the inner side of the first heater wire piece. In the adjustment section, the length of the first heater wire piece is smaller than the length of the second heater wire piece.

19 Claims, 8 Drawing Sheets

(51) Int. Cl.
*H05B 1/02* (2006.01)
*H05B 3/03* (2006.01)
*H05B 3/18* (2006.01)
*H05B 3/28* (2006.01)

(52) U.S. Cl.
CPC ............ *H05B 1/0233* (2013.01); *H05B 3/03* (2013.01); *H05B 3/18* (2013.01); *H05B 3/283* (2013.01); *H05B 2203/002* (2013.01); *H05B 2203/017* (2013.01); *H05B 2203/035* (2013.01)

(58) Field of Classification Search
CPC . H05B 3/03; H05B 3/18; H05B 3/283; H05B 2203/002; H05B 2203/017; H05B 2203/035; H05B 3/12; H01L 22/00
See application file for complete search history.

(56) References Cited

U.S. PATENT DOCUMENTS

| | | | |
|---|---|---|---|
| 2009/0039074 A1* | 2/2009 | Sasaki | H05B 3/42 219/544 |
| 2014/0097176 A1* | 4/2014 | Bobgan | H01L 21/68785 219/454.12 |
| 2016/0205726 A1* | 7/2016 | Spielmann | H05B 3/34 219/543 |

\* cited by examiner

HEATER SUBSTRATE, PROBE CARD SUBSTRATE, AND PROBE CARD

TECHNICAL FIELD

The present disclosure relates to a heater substrate, a probe card substrate, and a probe card.

BACKGROUND

Japanese Unexamined Patent Application Publication No. 2000-228270 discloses a disk-shaped heater used for heating a substrate in a semiconductor manufacturing process. In the disk-shaped heater, three parallel connected resistance wire pieces have uniform total lengths due to a wiring pattern in a central portion of the heater (refer to, for example, FIG. 7 of Japanese Unexamined Patent Application Publication No. 2000-228270).

SUMMARY

A heater substrate of the present disclosure has an insulating substrate having a first surface and a second surface on the opposite side relative to the first surface and at least one heating element of spiral shape including plural heater wire pieces and positioned in or on the insulating substrate, in which the heating element of spiral shape has at least one adjustment section including a turn of all or some of the plural heater wire pieces, in which the plural heater wire pieces include a first heater wire piece and a second heater wire piece adjacent to the inner side of the first heater wire piece, and in which, in the adjustment section, the length of the first heater wire piece is smaller than the length of the second heater wire piece.

The heater substrate of the present disclosure further has plural first circuit conductors positioned in a region from the first surface to the second surface and insulated from the heater wire pieces.

A probe card substrate of the present disclosure has the above-described heater substrate and a circuit board positioned on the first surface of the heater substrate and having plural second circuit conductors, in which the plural second circuit conductors are connected to the plural first circuit conductors.

A probe card of the present disclosure has the above-described probe card substrate and plural probe pins connected to the plural second circuit conductors.

DESCRIPTION OF EMBODIMENTS

Hereinafter, embodiments of the present disclosure will be described in detail with reference to the drawings.

Figure 1A:
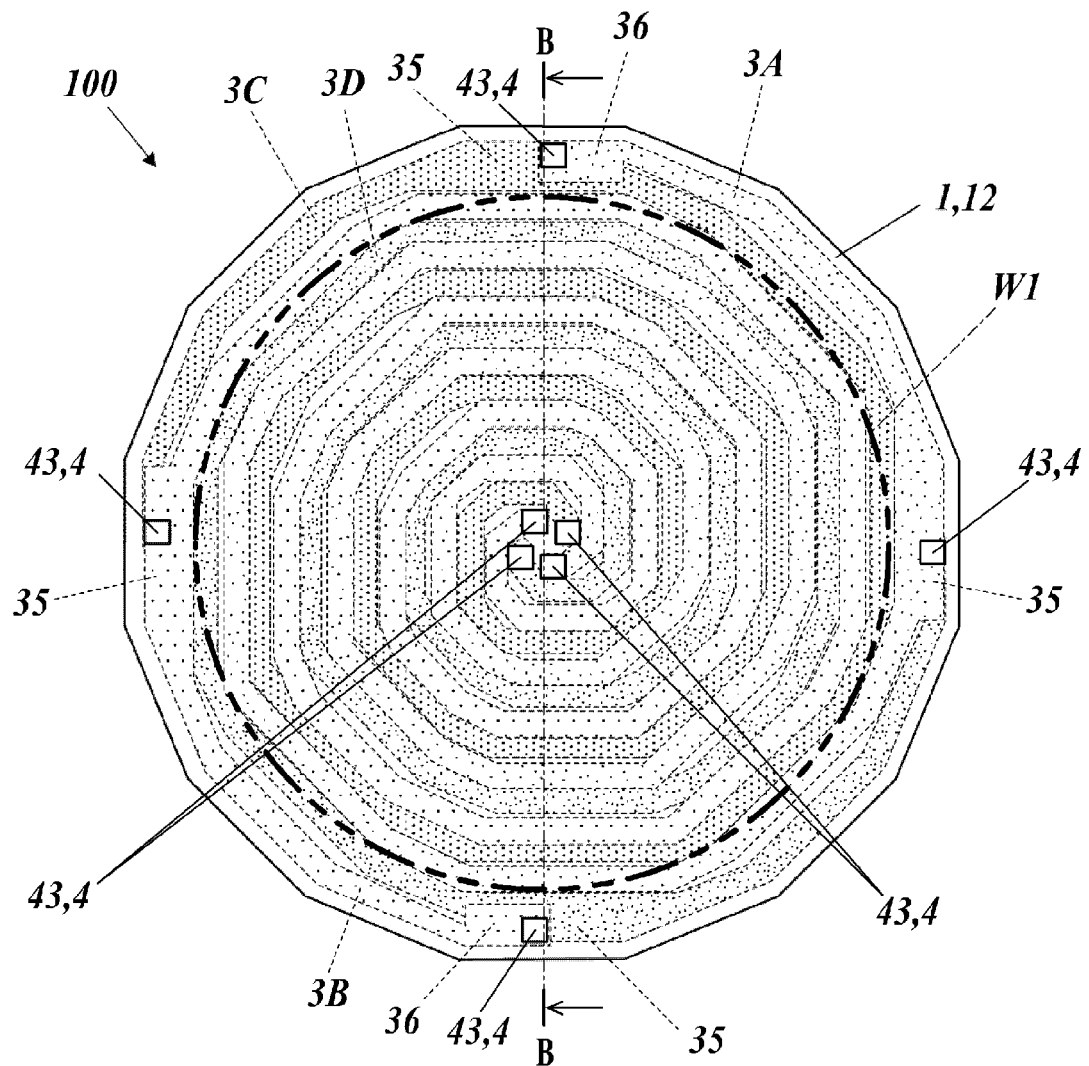
FIG. 1A is a plan view of a heater substrate of an embodiment of the present disclosure.
Figure 1B:
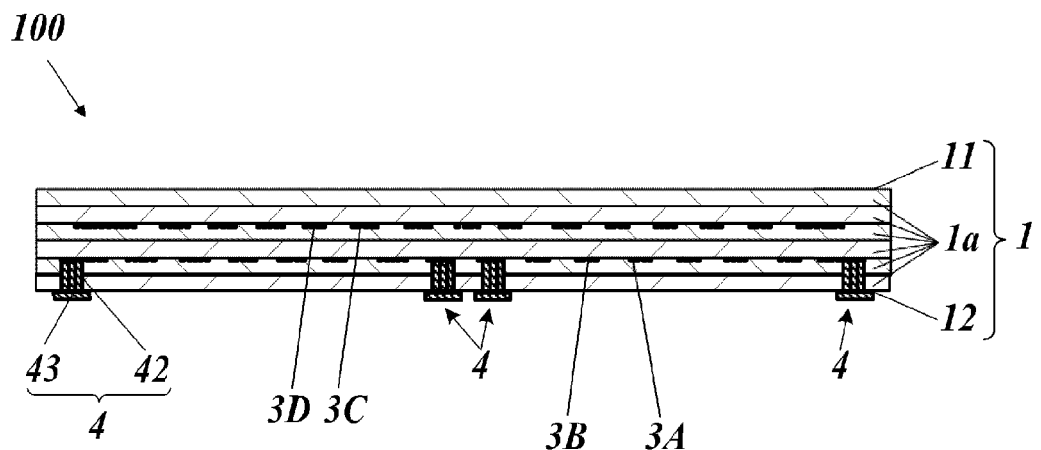
FIG. 1B is a sectional view taken along line B-B in FIG. 1A.
Figure 2A:
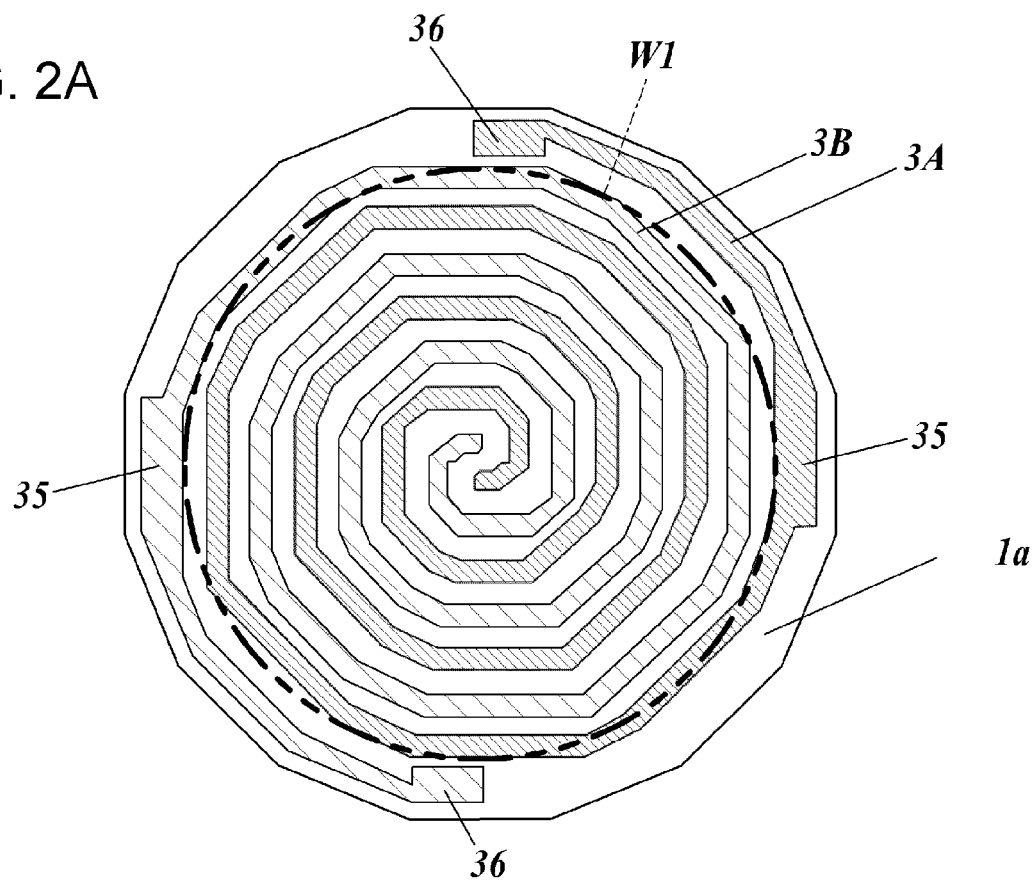
FIG. 2A is a plan view of one ceramic insulating layer of the heater substrate of the embodiment.
Figure 2B:
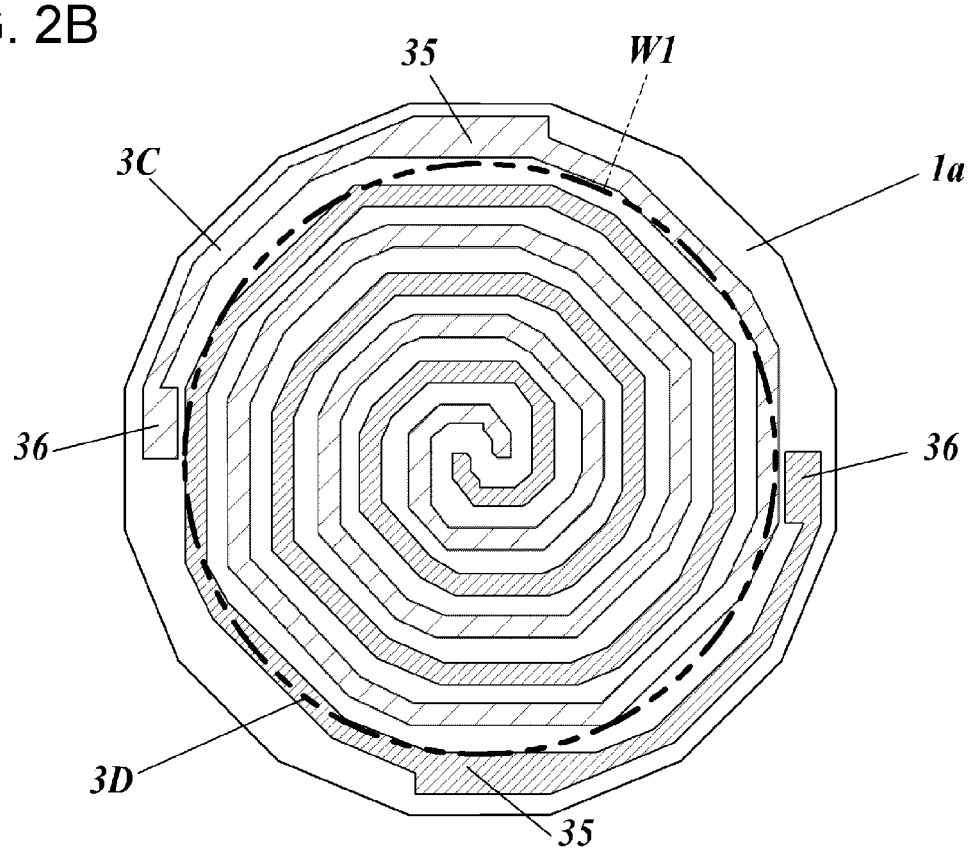
FIG. 2B is a plan view of another ceramic insulating layer of the heater substrate of the embodiment.
Figure 3:
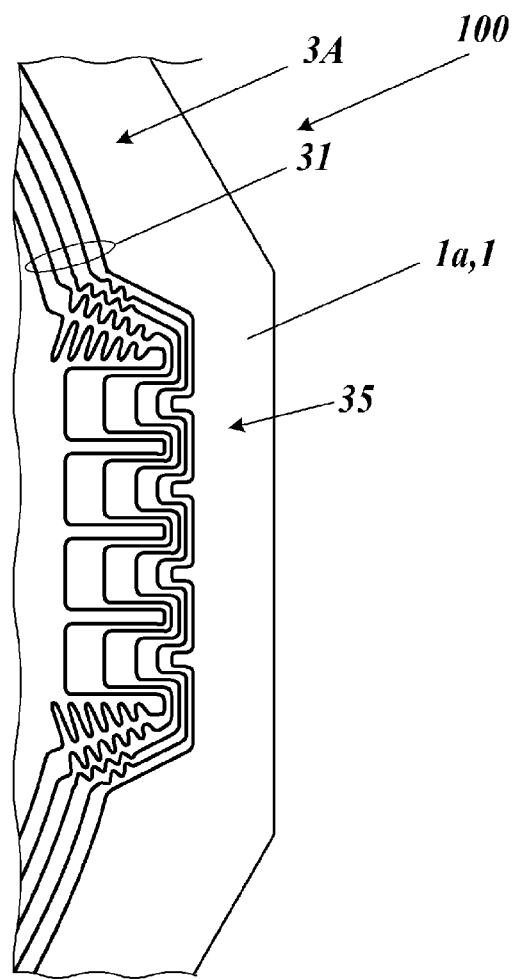
FIG. 3 is an enlarged view of details of a heating element.

FIG. 1A is a plan view of a heater substrate of an embodiment of the present disclosure. FIG. 1B is a sectional view taken along line B-B in FIG. 1A. FIG. 2A is a plan view of one ceramic insulating layer of the heater substrate of the embodiment. FIG. 2B is a plan view of another ceramic insulating layer of the heater substrate of the embodiment. FIG. 3 is an enlarged view of details of a heating element. Although, FIG. 1A, FIG. 1B, FIG. 2A, and FIG. 2B illustrate heating elements 3A to 3D as strip-shaped heating elements, each of the heating elements 3A to 3D is an assembly of plural (for example, ten pieces of) heater wire 31. In FIG. 3, for ease of viewing, five out of ten pieces of heater wire 31 included in the heating element 3A are not illustrated.

A heater substrate 100 of the embodiment of the present disclosure has an insulating substrate 1 having a first surface 11 and a second surface 12 on the opposite side relative to the first surface 11, the plural heating elements 3A to 3D, and a feeding conductor 4 for feeding power to the heating elements 3A to 3D from the outside. A region W1 of the heater substrate 100 from which an outer edge portion of the heater substrate 100 is removed, corresponds to a region that faces a heating target.

The insulating substrate 1 is a layered body having plural ceramic insulating layers 1a layered on one another and has insulating properties. As FIG. 2A and FIG. 2B illustrate, two heating elements 3A and 3B are positioned in the same surface of one ceramic insulating layer 1a, and two heating elements 3C and 3D are positioned in the same surface of another ceramic insulating layer 1a.

The first heating element 3A has a spiral shape elongated to one side. One end portion, in a longitudinal direction, of the heating element 3A is positioned in a central portion of the insulating substrate 1 (a central portion in the direction parallel to a surface of the substrate), and the other end portion of the heating element 3A is positioned on the outer circumferential side of the insulating substrate 1 (on the outer circumferential side in the direction parallel to the substrate surface). The substrate surface means the first surface 11 or the second surface 12. The longitudinal direction of the heating element 3A means the direction extending along the spiral shape of the heating element 3A. Note that the spiral-shaped heating element 3A may have a shape in which two heating elements 3A and 3B are connected at the central portion. In this case, the spiral-shaped heating element 3A has end portions, in the longitudinal direction, both positioned on the outer circumferential side of the insulating substrate 1.

As the enlarged view of FIG. 3 illustrates, the first heating element 3A includes plural heater wire pieces 31 that are arranged parallel to one another in a short direction of the heating element 3A (a direction of the width that is a shorter dimension). The plural heater wire pieces 31 extend from the one end portion to the other end portion, in the longitudinal direction, of the heating element 3A. The plural heater wire pieces 31 are positioned in the same layer of the insulating substrate 1 and do not intersect one another in the layer. When attention is paid to, in the plural heater wire pieces 31, a pair of mutually adjacent heater wire pieces 31, the heater wire piece positioned on the outer circumferential side of the insulating substrate 1 corresponds to a first heater wire piece according to the present disclosure, and the heater wire piece positioned on the inner circumferential side of the insulating substrate 1 corresponds to a second heater wire piece according to the present disclosure.

The first heating element 3A further has adjustment sections 35 and 36 including a turn of some or all of the plural heater wire pieces 31. If the parallel arranged plural heater wire pieces 31 are bent uniformly from one end toward the other end of each heater wire piece 31 to form a spiral shape, the lengths of the first heater wire piece 31 and the second heater wire piece 31 that is parallel arranged on the inner side relative to the first heater wire piece 31 differ from one another. The heater wire piece 31 on the inner side is shortened by the amount of reduction of the radius of curvature of the heater wire piece 31 on the inner side with respect to the radius of curvature of the heater wire piece 31 on the outer side. Each of the adjustment sections 35 and 36 has a pattern of turns of the heater wire pieces 31 so as to eliminate a difference in length between the heater wire pieces 31 that is generated due to such an above-described difference in disposition between the heater wire pieces 31.

In each section of the adjustment sections 35 and 36, the section length of a heater wire piece 31 on the inner side is larger than the section length of a heater wire piece 31 on the outer side due to such a turn pattern of the heater wire pieces 31. By the lengths of the plural heater wire pieces 31 in the adjustment sections 35 and 36 being adjusted, the plural heater wire pieces 31 included in the heating element 3A have substantially the same line length from one end to the other end.

The adjustment sections 35 and 36 are positioned in an outermost circumferential portion of the first heating element 3A. The outermost circumferential portion means a portion outside which any portion of the same heating element 3A is not positioned. One adjustment section 35 is positioned at the midway point of the heating element 3A in the longitudinal direction. The other adjustment section 36 is positioned in an end portion of the heating element 3A in the longitudinal direction. In addition, each of the adjustment sections 35 and 36 is positioned in a circumferential portion of the insulating substrate 1.

The second heating element 3B, the third heating element 3C, and the fourth heating element 3D have a configuration similar to the configuration of the first heating element 3A. The two heating elements 3A and 3B that are positioned in the same layer are arranged so as to be spaced apart from one another. The adjustment sections 35 and the adjustment sections 36 included in the two heating elements 3A and 3B are dispersedly arranged in the circumferential direction. Similarly, the third heating element 3C and the fourth heating element 3D that are positioned in another layer are arranged so as to be spaced apart from one another. The adjustment sections 35 and the adjustment sections 36 included in the heating elements 3C and 3D are dispersedly arranged in the circumferential direction. Being dispersedly arranged in the circumferential direction means the arrangement in which, when the central angle (360 degrees) of the insulating substrate 1 is equally divided by the number of the adjustment sections 35 and 36, each of the adjustment sections 35 and 36 is disposed in a corresponding one of the divided ranges of the central angle.

As FIG. 1A illustrates, when viewed in plan perspective (seen through in the direction orthogonal to the substrate surface), the two heating elements 3A and 3B that are positioned in one ceramic insulating layer 1a may be arranged so as to overlap the space between the two heating elements 3C and 3D that are positioned in another ceramic insulating layer 1a. Due to such an arrangement, the heating elements 3A to 3D are arranged without any space left therebetween when viewed in plan perspective (in the region W1, an area in which the heating elements 3A and 3B do not exist is reduced, and the heating elements 3A and 3B exist in almost all the region W1). Thus, the heat uniformity of the region W1 is improved.

A turn portion of the heater wire piece 31 is likely to become hot, and the adjustment sections 35 and 36 are thereby more likely to become hot than the other parts of the heating elements 3A to 3D. In contrast, at the outermost circumferential portion of each of the heating elements 3A to 3D, heat is likely to be dissipated toward the outer edge of the insulating substrate 1, thereby being hardly trapped in the outermost circumferential portion. In the present embodiment, the adjustment sections 35 and 36 are positioned in the outermost circumferential portion of each of the heating elements 3A to 3D and are dispersedly arranged in the circumferential direction; thus, the adjustment sections 35 and 36, which are likely to become hot, hardly have an effect on the region W1 facing a heating target, thereby not serving as an impediment to the heat uniformity of the region W1.

In addition, the adjustment section 36 is positioned in an end portion of each of the heating elements 3A to 3D. Because the feeding conductor 4 is connected to the end portion of each of the heating elements 3A to 3D, heat is likely to be dissipated outside along the feeding conductor 4. Thus, even when the adjustment section 36, which is likely to become hot, is provided, heat dissipation from the adjustment section 36 is improved, and the adjustment section 36 does not serve as an impediment to the heat uniformity of the region W1 facing a heating target.

Moreover, when viewed in plan perspective, the four adjustment sections 35 and 36 positioned in one ceramic insulating layer 1a may partially or entirely overlap the four adjustment sections 35 and 36 positioned in another ceramic insulating layer 1a. Furthermore, the adjustment section 35 and the adjustment section 36 may be arranged so as to overlap one another. There arises a difference in heat generation amount and in heat dissipation amount between the adjustment section 35 and the adjustment section 36, depending on the difference in length and depending on whether there is connection with the feeding conductor 4. In comparison to the case in which the adjustment section 35 and the adjustment section 35 overlap one another, and the adjustment section 36 and the adjustment section 36 overlap one another, in the case in which the adjustment section 35 and the adjustment section 36 overlap one another, when the overlapping portions of the adjustment sections are compared, a difference in temperature between the overlapping portions is smaller. That is, the uniformization of heat is improved. Furthermore, by the adjustment section 36 and the adjustment section 35 overlapping one another in the thickness direction of the insulating substrate 1, the heat generated at the adjustment section 35 is likely to be dissipated outside through the feeding conductor 4 connected to the adjustment section 36 in the immediate vicinity of the adjustment section 35. Thus, it is also possible to suppress the adjustment section 35 from serving as an impediment to the heat uniformity of the region W1.

Figure 4:
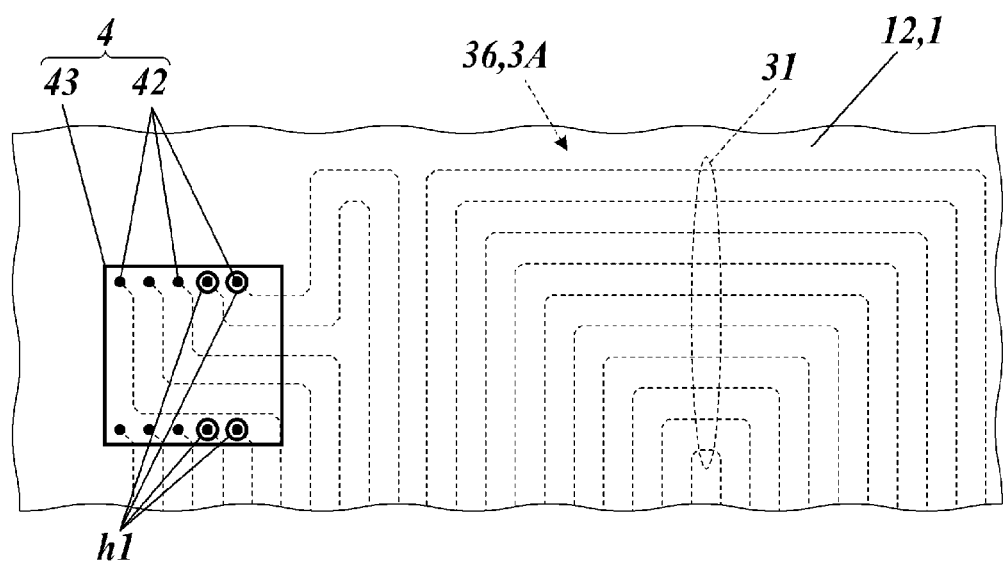
FIG. 4 is an enlarged view of a feeding electrode of a heater wire piece.

FIG. 4 is an enlarged view of a feeding electrode of a heater wire piece.

The feeding conductor 4 includes a feeding electrode 43 positioned on the second surface 12 and an internal conductor 42 positioned inside the insulating substrate 1 and being capable of electrically connecting the feeding electrode 43 to an end portion of each heater wire piece of the heating elements 3A to 3D. The internal conductor 42 is a via conductor extending in the direction orthogonal to the substrate surface and is positioned in a region from the second surface 12 to the heater wire piece 31. The internal conductor 42 may include a conductor extending in the direction parallel to the substrate surface of the insulating substrate 1.

As FIG. 4 illustrates, when an end portion of one heating element 3A is focused, the feeding conductor 4 has plural internal conductors 42 connected to the respective plural heater wire pieces 31 included in the heating element 3A and has a single feeding electrode 43. The single feeding electrode 43 is positioned in a range in which the feeding electrode 43 surrounds the plural internal conductors 42 (at least end portions of the plural internal conductors 42 on the second surface 12 side).

The feeding electrode 43 may have one or plural nonconductive portions (for example, through holes) h1. The nonconductive portion h1 prevents any one of the internal conductors 42 and the feeding electrode 43 from being electrically connected to one another. The nonconductive portion h1 is used for the following purpose. That is, it may be required that a predetermined electric current is passed through the heating element 3A when a predetermined voltage is applied to the feeding electrode 43. In addition, regarding the plural heater wire pieces 31, there may be manufacturing variation in the thickness and in the resistivity of conductor. Because there may be such manufacturing variation, the value of the electric current that is passed when a predetermined voltage is applied may approach the predetermined value by using some selected heater wire pieces 31 rather than by using all the plural heater wire pieces 31. In such a case, there is provided one or plural heater wire pieces 31 that are prevented from being fed with power by using the nonconductive portion h1. The feeding electrode 43 is formed in a process performed after a manufacturing process of the plural heater wire pieces 31 and the plural internal conductors 42. Thus, before the manufacturing process of the feeding electrode 43, the resistance of the plural heater wire pieces 31 is measured, the number of the selected heater wire pieces 31 is determined based on the result obtained through the measurement, and the number of the nonconductive portions h1 can thus be selected in the manufacturing process of the feeding electrode 43.

As FIG. 1A illustrates, the heater substrate 100 has plural feeding conductors 4, each of which is connected to one of both ends of a corresponding one of the four heating elements 3A to 3D.

Figure 5A:
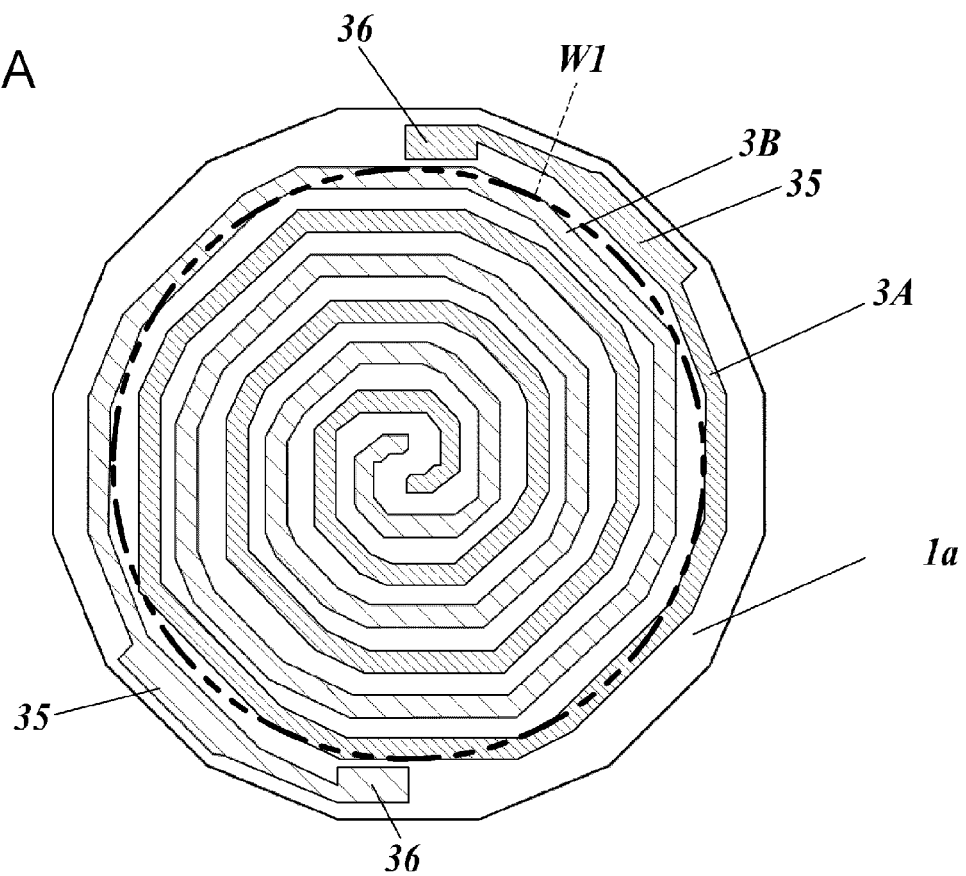
FIG. 5A is a plan view of one ceramic insulating layer for illustrating a modification of the arrangement of adjustment sections.
Figure 5B:
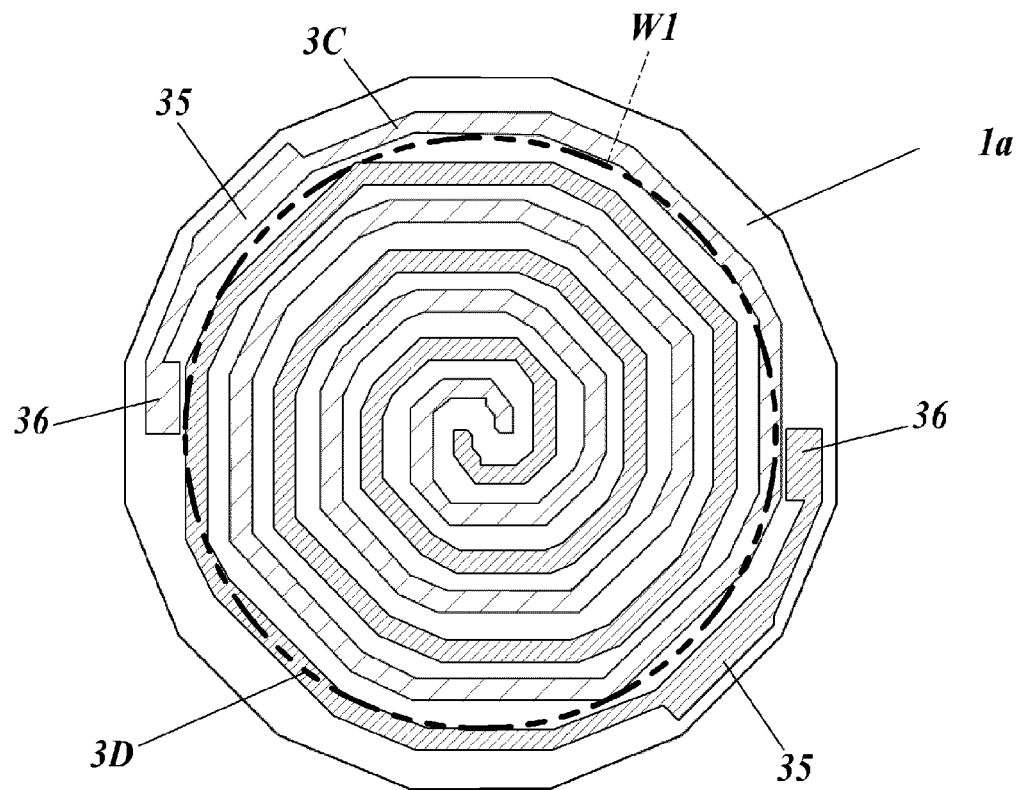
FIG. 5B is a plan view of another ceramic insulating layer for illustrating the modification of the arrangement of the adjustment sections.

Each of FIG. 5A and FIG. 5B illustrates a modification of the arrangement of the adjustment sections. In the above-described embodiment, the four adjustment sections 35 and 36 positioned in one ceramic insulating layer 1a partially or entirely overlap the four adjustment sections 35 and 36 positioned in another ceramic insulating layer 1a, when viewed in the direction orthogonal to the substrate surface (refer to FIG. 2A and FIG. 2B). However, as FIG. 5A and FIG. 5B illustrate, the adjustment sections may be arranged so as not to overlap one another, and all the adjustment sections 35 and 36 positioned in plural ceramic insulating layers 1a may be dispersedly arranged in the circumferential direction. Due to such an arrangement, all the adjustment sections 35 and 36, whose heat generation amount is larger than the heat generation amount of other parts, are dispersedly arranged in the circumferential direction, and the heat uniformity of the region W1 is thereby further improved. Furthermore, in the case of FIG. 5A and FIG. 5B, the adjustment sections 35 and the adjustment sections 36 that have heat generation properties and heat dissipation properties different from those of the adjustment sections 35 are alternately arranged, and the heat uniformity of the region W1 is thereby further improved.

<Adjustment Section>

FIGS. 6A to 6E illustrate respectively the patterns of Modifications 1 to 5 of the adjustment section. FIGS. 7A to 7C illustrate respectively the patterns of Modifications 6 to 8 of the adjustment section. FIGS. 8A to 8E illustrate respectively the patterns of Modifications 9 to 13 of the adjustment section. Note that, although the cases of four heater wire pieces 31, five heater wire pieces 31, and three heater wire pieces 31 are illustrated in Modifications 1 to 13 mentioned above, the number of the heater wire pieces 31 may be 10, for example, and may be appropriately increased or decreased according to the number of the heater wire pieces 31 included in the heating elements 3A to 3D. In FIG. 6A, FIG. 6B, FIG. 6C, FIG. 6E, and FIGS. 7A to 7C, portions illustrated by the dotted line represent mainly a part in which a heater wire piece 31 on the inner side is longer than a heater wire piece 31 on the outer side. In FIGS. 6A to 8E, an outer area and an inner area in the radial direction of the insulating substrate 1 are respectively given as the "outer side" and the "inner side".

Each of the adjustment sections 35 and 36 is a pattern section having a turn of some or all of the plural heater wire pieces 31. Such a turn means a pattern form by which the direction of the electric current before passing through the turn and the direction of the electric current after passing through the turn are reversed when electric current flows in one heater wire piece 31. The turn portion of the heater wire piece 31 may be a pattern form formed by the heater wire piece 31 being bent to while having an angle as in FIGS. 6A to 6C, FIG. 6E, and FIGS. 7A to 7C or may alternatively be a pattern form formed by the heater wire piece 31 being curved while having a finite radius of curvature as in FIG. 6D and FIGS. 8A to 8E.

Figure 6A:
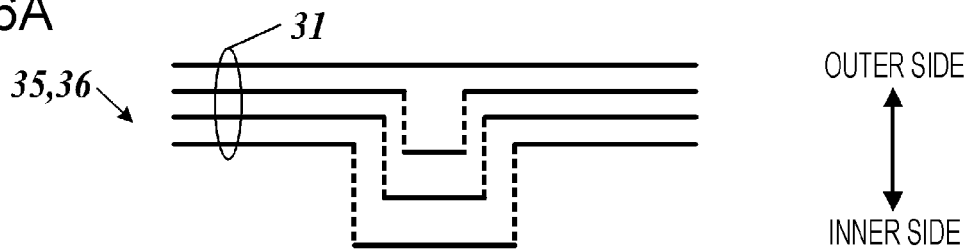
FIG. 6A illustrates the pattern of Modification 1 of the adjustment section.
Figure 6B:
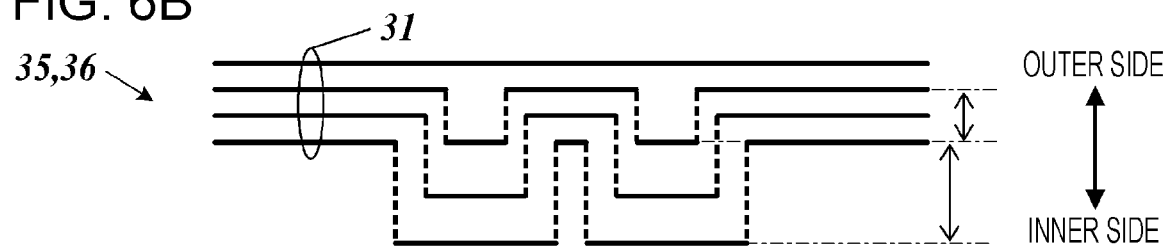
FIG. 6B illustrates the pattern of Modification 2 of the adjustment section.
Figure 7A:
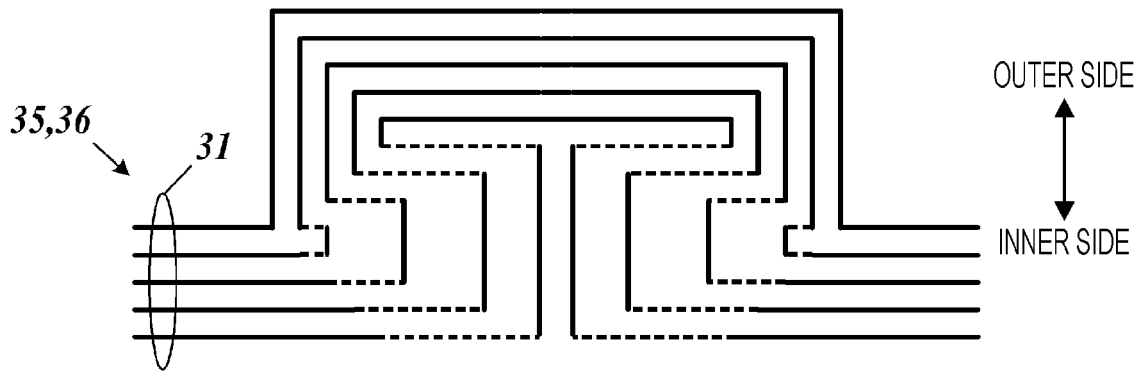
FIG. 7A illustrates the pattern of Modification 6 of the adjustment section.
Figure 7B:
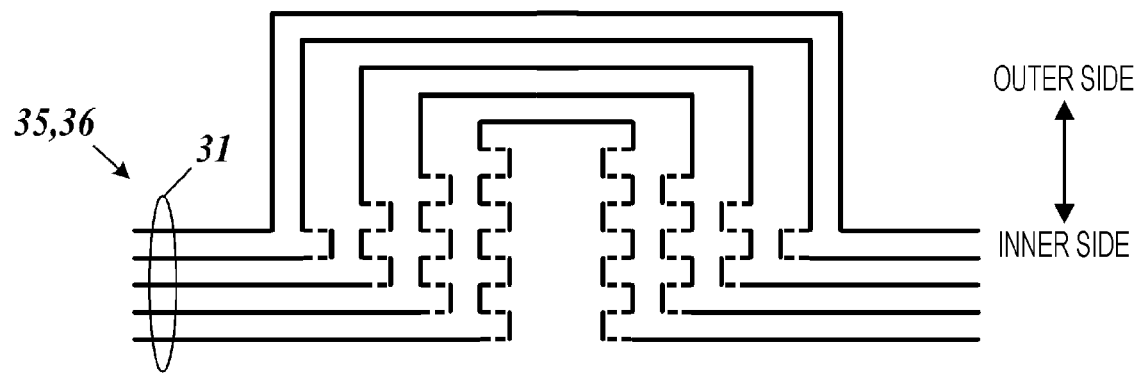
FIG. 7B illustrates the pattern of Modification 7 of the adjustment section.
Figure 7C:
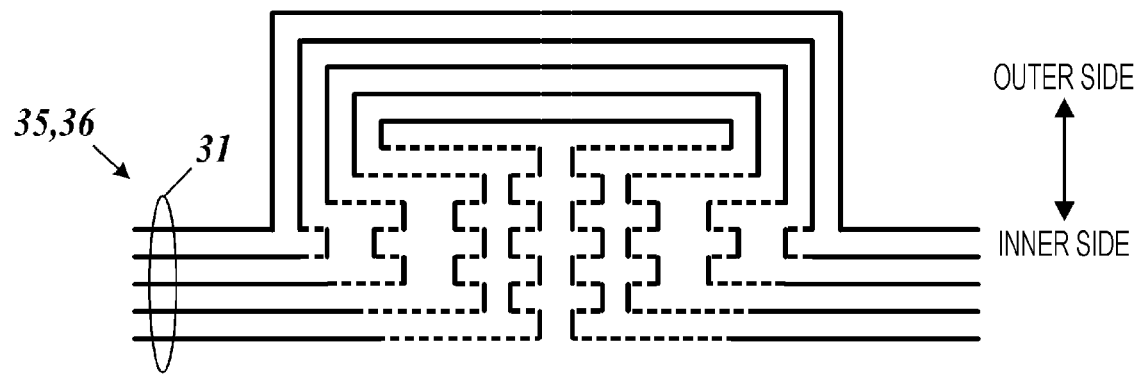
FIG. 7C illustrates the pattern of Modification 8 of the adjustment section.

Each of the adjustment sections 35 and 36 in FIG. 6A is an example in which, in the turn pattern of the heater wire pieces 31, the lengths of lines (illustrated by the dotted lines), extending in the radial direction of the insulating substrate 1, of a heater wire piece 31 on the inner side and a heater wire piece 31 on the outer side differ from one another. Each of the adjustment sections 35 and 36 in FIG. 6B is an example in which plural patterns, each of which is the same as the pattern in FIG. 6A, are arranged in the circumferential direction of the insulating substrate 1. By such plural patterns being arranged, the difference in length between the heater wire pieces 31 can be increased several times. The plural turn patterns may be patterns between which the line lengths of the lines extending in the radial direction differ from one another. Finer adjustment of the lengths of the heater wire pieces 31 is enabled by such turn patterns, which have different lengths, being combined.

Figure 6C:
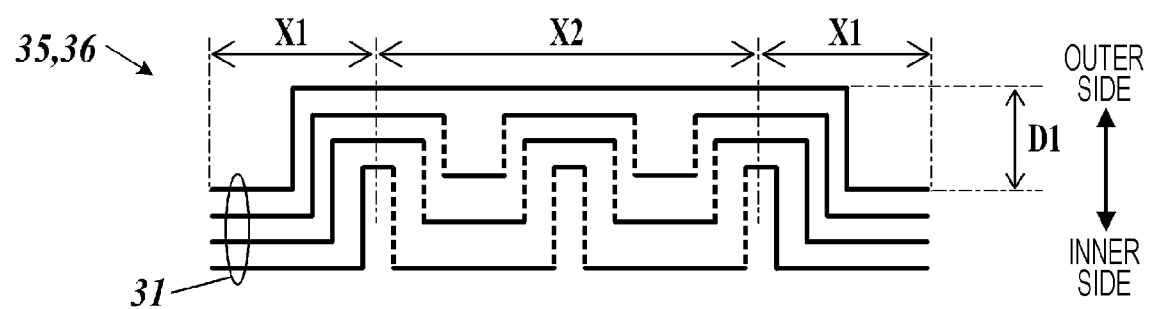
FIG. 6C illustrates the pattern of Modification 3 of the adjustment section.

Each of the adjustment sections 35 and 36 in FIG. 6C has, in addition to a range X2 in which the lengths of the heater wire pieces 31 differ from one another, parts X1 that are positioned on both sides of the range X2 in the circumferential direction of the insulating substrate 1 and in which the heater wire pieces 31 are displaced outward. Due to the parts X1, the adjustment sections 35 and 36 can be protruded, by a length D1, toward the outer side of the insulating substrate 1. Due to such protrusion, the adjustment sections 35 and 36, which are likely to become hot, can be spaced apart from the region W1 facing a heating target.

Figure 6D:
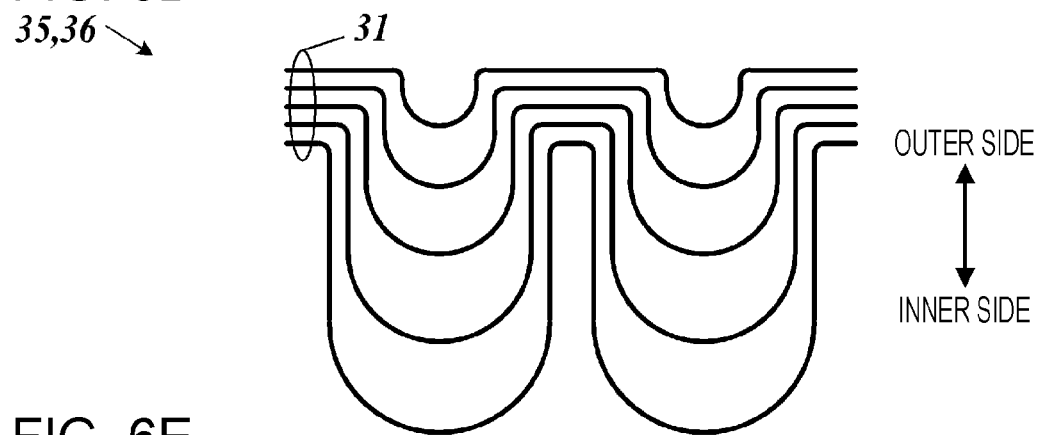
FIG. 6D illustrates the pattern of Modification 4 of the adjustment section.

As with the adjustment sections 35 and 36 in FIG. 6D, the heater wire piece 31 may be bent without forming any angle. Regarding the adjustment sections 35 and 36 in FIG. 6D, the turn of each heater wire piece 31 turns so as to protrude inward but does not have any angle. Such a turn without any angle hardly becomes hot compared with the turn with an angle, thereby having a small influence on the heat uniformity of the region W1. In addition, even if the turn or other parts are bent while having an angle, such a bent, angled portion hardly becomes hot when being rounded. As in the example illustrated in FIG. 3 and FIG. 4, a bent, angled portion of the heater wire piece 31 can be rounded.

Figure 6E:
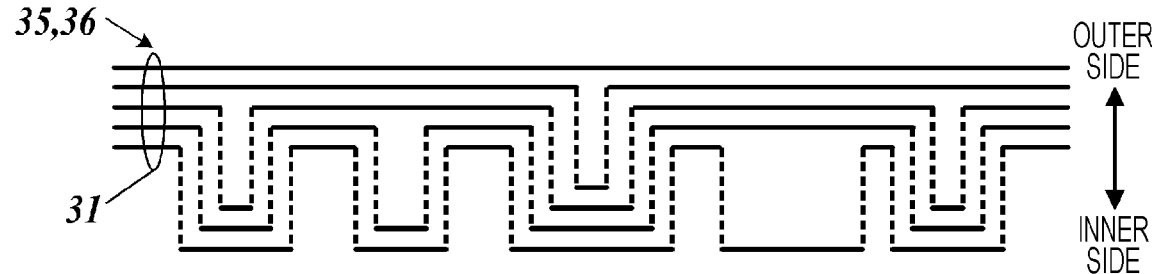
FIG. 6E illustrates the pattern of Modification 5 of the adjustment section.

Each of the adjustment sections 35 and 36 in FIG. 6E is an example in which the number of turns differs between a heater wire piece 31 on the inner side and a heater wire piece 31 on the outer side. In the turn pattern, between a heater wire piece 31 on the inner side and a heater wire piece 31 on the outer side, the lengths of the lines (illustrated by the dotted line) extending in the radial direction of the insulating substrate 1 are the same; however, the number of the turn patterns arranged in the circumferential direction differs from one another. Because the line of the heater wire piece 31 extending in the radial direction, in the turn pattern, contributes to lengthening the heater wire piece 31, the width of the turn pattern in the circumferential direction (interval between the lines extending in the radial direction) may thus vary.

Each of the adjustment sections 35 and 36 in FIGS. 7A to 7C is an example in which a heater wire piece 31 has a line portion (illustrated by the dotted line) turning not only in the radial direction of the insulating substrate 1 but also in the circumferential direction of the insulating substrate 1. By changing the length of the line turning in the circumferential direction or the number of times the line turns in the circumferential direction, the difference between the line length of a heater wire piece 31 on the inner side and the line length of a heater wire piece 31 on the outer side can be increased or decreased. Each of the adjustment sections 35 and 36 in FIG. 7A is an example in which the lengths of lines turning in the circumferential direction differ from one another, each of the adjustment sections 35 and 36 in FIG. 7B is an example in which the number of lines turning in the circumferential direction varies, and each of the adjustment sections 35 and 36 in FIG. 7C is an example of a combination of the example of FIG. 7A and the example of FIG. 7B.

Figure 8A:
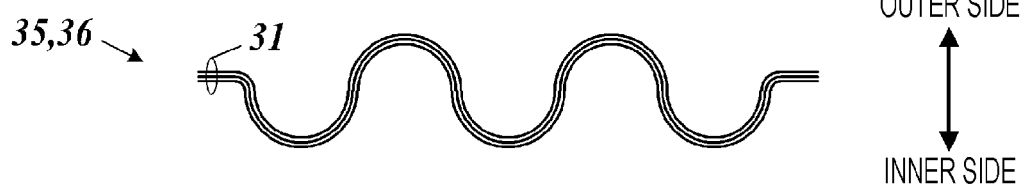
FIG. 8A illustrates the pattern of Modification 9 of the adjustment section.
Figure 8B:
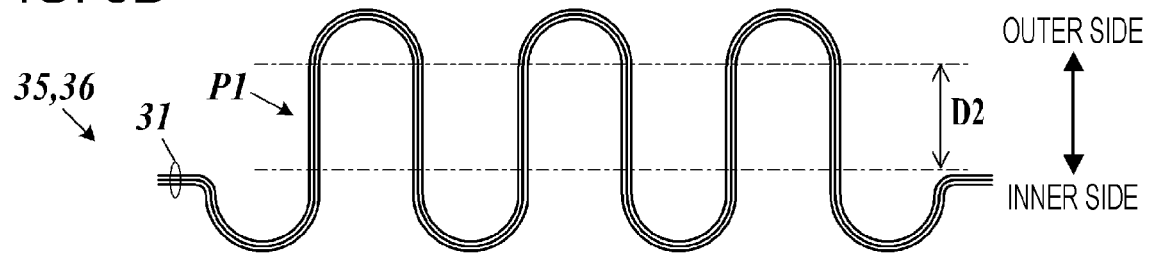
FIG. 8B illustrates the pattern of Modification 10 of the adjustment section.

Each of the adjustment sections 35 and 36 in FIG. 8A and FIG. 8B is an example in which a heater wire piece 31 on the inner side is made longer than a heater wire piece 31 on the outer side due to the difference between the number of semicircular-arc portions of the heater wire piece 31 protruding inward and the number of semicircular-arc portions of the heater wire piece 31 positioned on the outer side. As FIG. 8B illustrates, in a heater wire piece 31, a line P1 extending in the radial direction of the substrate surface connects between a semicircular arc-shaped portion positioned on the inner side and a semicircular arc-shaped portion positioned on the outer side, and it is thereby possible to optionally change the amount by which the semicircular-arc portion on the outer side or the semicircular-arc portion on the inner side protrudes, by a length D2 of the line P1 being adjusted.

Figure 8C:
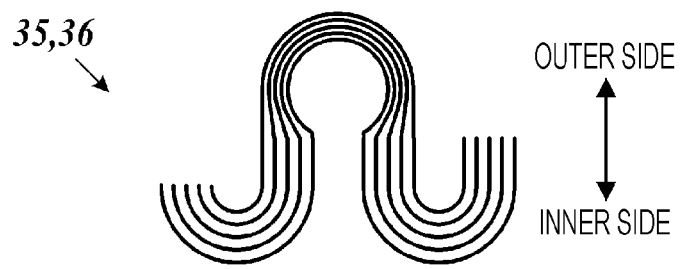
FIG. 8C illustrates the pattern of Modification 11 of the adjustment section.
Figure 8D:
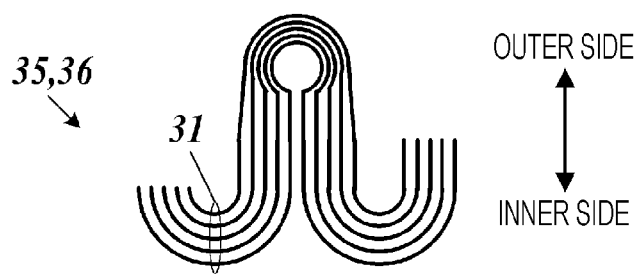
FIG. 8D illustrates the pattern of Modification 12 of the adjustment section.

Each of the adjustment sections 35 and 36 in FIG. 8C and FIG. 8D is an example in which, in an arc portion positioned on the outer side, the space between a heater wire piece 31 on the inner side and a heater wire piece 31 on the outer side is narrowed. Each of the adjustment sections 35 and 36 in FIG. 8C is an example in which the diameter of an arc portion on the inner circumferential side is increased. Each of the adjustment sections 35 and 36 in FIG. 8D is an example in which the diameter of an arc portion on the outer circumferential side is decreased. By the space being narrowed, the difference in length between the arc portions of the heater wire pieces 31 is reduced. Thus, the arc portion positioned on the outer side and the semicircular arc portion positioned on the inner side are combined, and the heater wire piece 31 on the inner side is made longer than the heater wire piece 31 on the outer side.

Figure 8E:
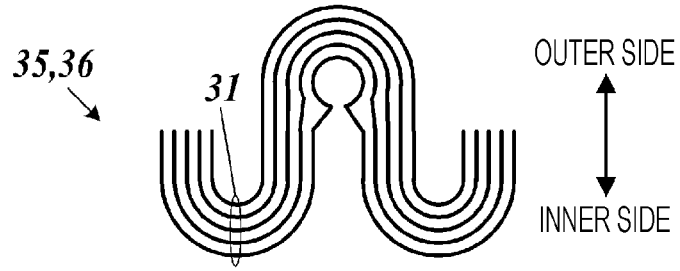
FIG. 8E illustrates the pattern of Modification 13 of the adjustment section.

Each of the adjustment sections 35 and 36 in FIG. 8E is an example in which, in the arc portions positioned on the outer side, the central angle of the arc portion is larger as the arc portion is positioned closer to the inner side. With such a pattern, in one arc portion assembly positioned on the outer side, the difference in length between a heater wire piece 31 on the inner circumferential side and a heater wire piece 31 on the outer circumferential side is also decreased, and the heater wire piece 31 on the inner side is also made longer, in total, than the heater wire piece 31 on the outer side.

With the patterns of arc illustrated in FIGS. 8C to 8E, the patterns are formed by an arc portion positioned on the outer side and an arc portion positioned on the inner side being alternately repeated a greater number of times, and the difference in length between a heater wire piece 31 on the outer side and a heater wire piece 31 on the inner side can thereby be multiplied by the same number as the number of such reputation.

As described above, according to the heater substrate 100 of the present embodiment, each of the heating elements 3A to 3D including the plural heater wire pieces 31 has a spiral shape. Thus, a pattern of the heater wire pieces 31 with a small number of turns can be adopted in a large part of each of the heating elements 3A to 3D, and the heat uniformity of the heater substrate 100 can thereby be improved. Moreover, each of the heating elements 3A to 3D has, as a part, the adjustment sections 35 and 36 including a turn of a heater wire piece 31, and the adjustment sections 35 and 36 have a pattern in which a heater wire piece 31 on the inner side is longer than a heater wire piece 31 on the outer side. Thus, due to the adjustment sections 35 and 36, the total length of each of the plural heater wire pieces 31 included in the heating elements 3A to 3D can be nearly the same. Accordingly, when a predetermined voltage is applied to the heating elements 3A to 3D, the electric currents being passed in the heater wire pieces 31, that is, the heat generation amounts of the heater wire pieces 31 are equivalent to one another. Consequently, the heat uniformity of the heater substrate 100 can be improved.

Moreover, according to the heater substrate 100 of the present embodiment, the adjustment sections 35 and 36 are positioned in the outer circumferential portion of each of the heating elements 3A to 3D. At the outer circumferential portion of each of the heating elements 3A to 3D, heat is likely to be dissipated to an outer edge portion of the insulating substrate 1. Thus, it is possible to reduce the influence of the adjustment sections 35 and 36, which are likely to become hot, on the heat uniformity of the heater substrate 100.

In addition, according to the heater substrate 100 of the present embodiment, the adjustment section 36 is positioned in an end portion of each of the heating elements 3A to 3D. At such an end portion of each of the heating elements 3A to 3D, heat is likely to be dissipated through the feeding conductor 4. Thus, it is possible to reduce the influence of the adjustment sections 36, which is likely to become hot, on the heat uniformity of the heater substrate 100.

Moreover, according to the heater substrate 100 of the present embodiment, the plural adjustment sections 35 and 36 are dispersedly arranged in the circumferential direction of the insulating substrate 1. Thus, it is possible to reduce the influence of the adjustment sections 35 and 36, which are likely to become hot, on the heat uniformity in the circumferential direction of the heater substrate 100.

In addition, according to the heater substrate 100 of the present embodiment, some of the plural heater wire pieces 31 are not connected to the feeding electrode 43. The number of the heater wire pieces 31 to be connected to the feeding electrode 43 is adjusted as described above, and the combined value of the electric current that is passed in each of the heating elements 3A to 3D can be made to approach a desired value even when there is manufacturing variation in the resistivity of the heater wire pieces 31.

<Probe Card>

Figure 9A:
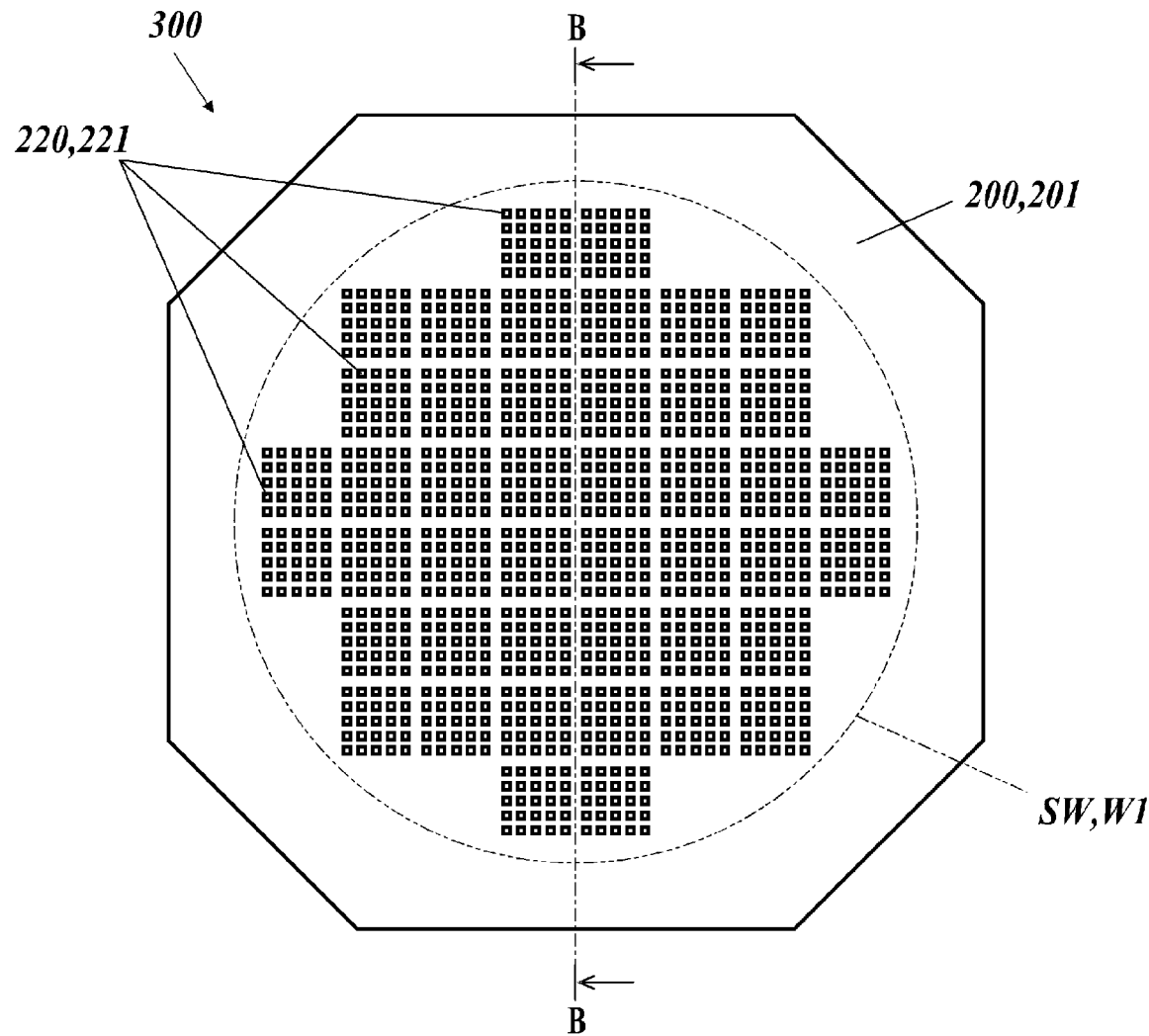
FIG. 9A is a plan view of a probe card substrate of an embodiment of the present disclosure.
Figure 9B:
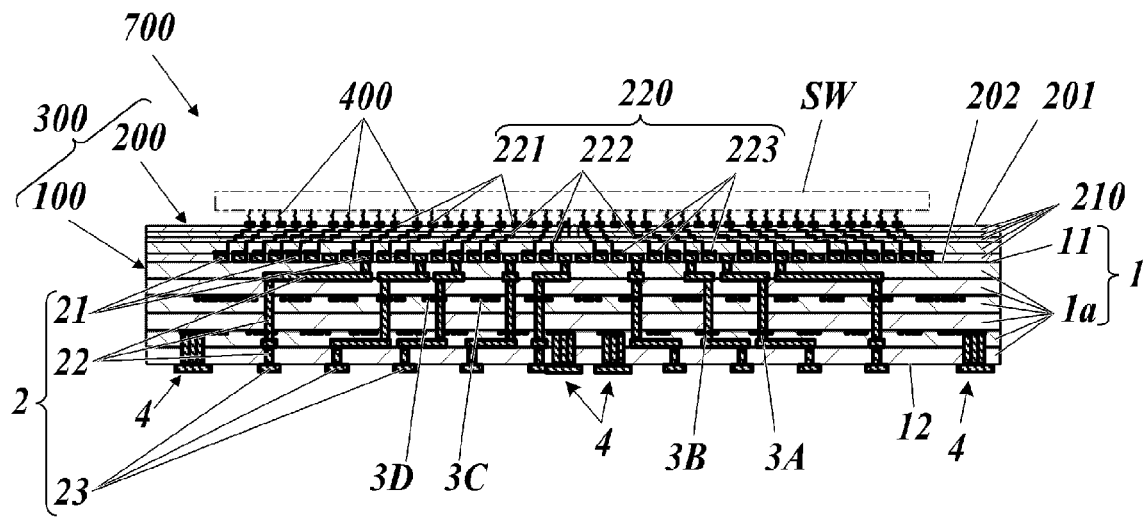
FIG. 9B is a sectional view taken along line B-B in FIG. 9A.

FIG. 9A is a plan view of a probe card substrate of an embodiment of the present disclosure. FIG. 9B is a sectional view of a probe card taken along line B-B in FIG. 9A.

A probe card 700 of the embodiment of the present disclosure is a component to be incorporated in an apparatus for inspecting plural semiconductor devices on a wafer SW, and the probe card 700 sends a signal or a voltage to each of the semiconductor devices and receives a signal or a voltage from the semiconductor device with a probe pin 400 being in contact with a terminal of the semiconductor device. The probe card 700 has a probe card substrate 300 and the probe pins 400 fixed to the probe card substrate 300. The probe card substrate 300 has the heater substrate 100 and a circuit board 200 positioned on the first surface 11 of the heater substrate 100.

The heater substrate 100 has, in addition to the constituents given in the above-described embodiment, plural first circuit conductors 2 positioned in a region from the first surface 11 to the second surface 12 and insulated from the heating elements 3A to 3D. Each of the first circuit conductors 2 has a joint conductor 21 positioned on the first surface 11, an internal conductor 22 positioned inside the insulating substrate 1, and an external terminal 23 positioned on the second surface 12. Regarding the internal conductor 22, one end is connected to the joint conductor 21, the other end is connected to the external terminal 23, and the internal conductor 22 electrically connecting the external terminal 23 and the joint conductor 21 to one another. The internal conductor 22 may include a portion extending in the direction orthogonal to the substrate surface of the heater substrate 100 and a portion extending in the direction parallel to the substrate surface.

The internal conductor 22 extends from the first surface 11 to the second surface 12 while passing through a space between the plural heater wire pieces 31 included in the heating elements 3A to 3D, thereby not being electrically conductive with the heating elements 3A to 3D.

The circuit board 200 has plural resin insulating layers 210 that are layered on one another and has second circuit conductors 220. The second circuit conductors 220 includes plural joint conductors 221 positioned on a third surface 201 of the circuit board 200, plural joint conductors 223 positioned on a fourth surface 202 on the opposite side relative to the third surface 201, and plural internal conductors 222 positioned, in the circuit board 200, in a region from the third surface 201 to the fourth surface 202 and electrically connecting the plural joint conductors 221 and the plural joint conductors 223.

The plural joint conductors 221 are arranged so as to correspond to the terminals of the semiconductor devices on the wafer SW and are connected to the respective probe pins 400. The plural joint conductors 223 are arranged so as to correspond to plural joint conductors 21 of the heater substrate 100 and are connected to the plural joint conductors 21.

As described above, according to the probe card 700 having the heater substrate 100, by the heating elements 3A to 3D being caused to generate heat, the heater substrate 100, the circuit board 200, and the wafer SW being an inspection target can be heated. The heating elements 3A to 3D of the heater substrate 100 are adjusted to obtain a predetermined electric resistance by the number of the heater wire pieces 31 to be energized being selected. In addition, the parallel connected heater wire pieces 31 have uniform lengths. Moreover, each of the heating elements 3A to 3D has a spiral shape and includes a small number of turns except for the adjustment sections 35 and 36. The heater substrate 100 having such a configuration can improve the heat uniformity in heating the wafer SW. Furthermore, the adjustment sections 35 and 36 including a large number of turns of the heater wire pieces 31 are positioned in the outermost circumferential portions of the heating elements 3A to 3D, and it is thereby possible to obtain high heat uniformity in heating performed at the region W1 facing the wafer SW.

One Example of Manufacturing Method

The ceramic insulating layer 1a of the insulating substrate 1 is made of, for example, a ceramic sintered body such as an aluminum oxide sintered body, an aluminum nitride sintered body, a silicon carbide sintered body, a mullite sintered body, or a glass-ceramic. A mullite sintered body and some glass-ceramics have thermal expansion coefficients smaller than the thermal expansion coefficients of other ceramic sintered bodies described above and have thermal expansion coefficients close to the thermal expansion coefficient of the silicon of the substrate of the wafer SW that is to be inspected. Thus, when the heater substrate 100 is used for an inspection as the probe card 700, between the electrode disposed on the wafer SW and the probe pin 400, misalignment to which the temperature of the environment during the inspection contributes hardly occurs. Thus, the probe card 700 having excellent inspection accuracy can be provided. When an aluminum oxide sintered body, an aluminum nitride sintered body, and a silicon carbide sintered body are used, strength thereof and also thermal conductivity thereof are higher than those of a mullite sintered body and glass-ceramics, and the insulating substrate 1 has high rigidity and is excellent in thermal conduction of the heat generated at the heater wire piece 31 to the wafer SW.

When being made of, for example, an aluminum oxide sintered body, the insulating substrate 1 can be produced as follows. First, a raw material in powder form that mainly contains aluminum oxide powder and, for example, silicon oxide powder serving as a sintering aid component is mixed with an organic solvent and a binder, and slurry is formed. The slurry is shaped into a sheet shape by a shaping method such as the doctor blade method or the lip coater method, and a ceramic green sheet (hereinafter, also referred to as a green sheet) serving as the ceramic insulating layer 1a is prepared. Next, plural green sheets are layered on top of one another into a layered body. Subsequently, the layered body is fired at a temperature of about 1300° C. to 1600° C. to produce the insulating substrate 1.

The first circuit conductor 2 contains, as a conductor component, a metallic material such as tungsten, molybdenum, manganese, or copper, or an alloy material containing a metallic material described above. For example, such a metallic material (alloy material) is sintered at the same time as the firing of the ceramic green sheet and is formed into a metallized conductor in the insulating substrate 1 and on a surface the insulating substrate 1. The first circuit conductor 2 may contain an inorganic component such as glass or ceramics so as to increase, for example, sinterability or the joining strength with a ceramic material.

When being constituted by, for example, metallization layers of tungsten, the joint conductor 21 of the first circuit conductor 2, the internal conductor layer (a portion extending in the direction parallel to the substrate surface) of the internal conductor 22, and the external terminal 23 can be formed as follows. For example, the joint conductor 21 of the first circuit conductor 2, the internal conductor layer of the internal conductor 22, and the external terminal 23 can be formed by a method in which metallic paste that is prepared by tungsten powder being mixed with an organic solvent and with an organic binder is printed onto the above-described green sheet serving as the ceramic insulating layer 1a, at a predetermined position, by a screen printing method or other methods, and the metallic paste is fired with the green sheet. In addition, a via conductor (a portion extending in the direction orthogonal to the substrate surface) of the internal conductor 22 can be formed by a through hole being formed at a predetermined position in the green sheet and by the through hole being filled with metallic paste similar to the above-described metallic paste before the above-described printing of the metallic paste is performed.

On the surfaces of exposed conductor layers as with the joint conductor 21 and the external terminal 23, a nickel film of about 1 to 10 μm in thickness and a gold film of about 0.1 to 3 μm in thickness are formed in turn, and it is thereby possible to protect the surfaces of the exposed conductor layers and to improve the joining property of, for example, a brazing material and solder. Such a nickel film and gold film can be formed by using a plating film formed by electrolytic plating or a thin film.

The joint conductor 21 can be formed by using such an above-described metallized conductor or can alternatively be formed by using a wiring layer of a thin-film conductor. The wiring layer of the thin-film conductor can be prepared, for example, as follows. First, by a thin-film forming method such as spattering, a joint metallic layer having a thickness of about 0.1 to 3 μm and made of a metal such as titanium or chromium is formed on the entire first surface 11 of the insulating substrate 1 having the internal conductor 22 and the external terminal 23 that are metallized conductors. Next, a main conductor layer having a thickness of about 2 to 10 μm and made of, for example, copper is formed on the entire surface of the joint metallic layer to form a conductive thin-film layer. A barrier layer, for example, may be formed as required. The joint conductor 21 in thin-film form can then be formed by the conductive thin-film layer being patterned by photolithography.

The first surface 11 of the insulating substrate 1 can be flattened by, for example, polishing, before the above-described thin-film joint conductor 21 is formed on the first surface 11. Due to such a process, the thin-film joint conductor 21 can accurately be formed.

The heater wire piece 31 can be made of a metallization layer and formed by using a material and a method similar to those used for the joint conductor 21 of the first circuit conductor 2, the internal conductor layer of the internal conductor 22, and the external terminal 23. For example, metallic paste made by a high resistance component such as ceramic particles being added to the metallic paste used for the first circuit conductor 2 can also be used as the metallic paste for the heater wire piece 31. The internal conductor 42 of the feeding conductor 4 can be formed by using a material and a method similar to those used for the via conductor of the internal conductor 22. The feeding electrode 43 of the feeding conductor 4 can be formed by the second surface 12 of the insulating substrate 1 being patterned with the thin-film conductor by using photolithography. With such a forming method, high dimensional accuracy can be obtained. The feeding electrode 43 may be formed into a metallized conductor by conductor paste being applied to the insulating substrate 1 that has been sintered and by being baked on the insulating substrate 1.

The circuit board 200 has the plural resin insulating layers 210 (the resin insulating substrate) layered on one another as described above. The number and thickness of the resin insulating layers 210 are set according to, for example, the number of electrodes of the semiconductor devices to be inspected and are set so that the resin insulating layers 210 are connected to the first circuit conductors 2 (the joint conductors 21) of the heater substrate 100 to enable the first circuit conductors 2 to develop.

The resin insulating layer 210 is made of an insulating resin such as a polyimide resin, a polyamide imide resin, a siloxane-modified polyamide imide resin, a siloxane-modified polyimide resin, a polyphenylene sulfide resin, a wholly aromatic polyester resin, a BCB (benzocyclobutene) resin, an epoxy resin, a bismaleimide triazine resin, a polyphenylene ether resin, a polyquinoline resin, and a fluorocarbon resin.

The resin insulating layer 210 may contain a filler for formability and for adjusting thermal expansion coefficient. Such a filler may be, for example, an inorganic filler such as barium sulfate, barium titanate, amorphous silica, crystalline silica, fused silica, spherical silica, talc, clay, magnesium carbonate, calcium carbonate, aluminum oxide, aluminum hydroxide, silicon nitride, aluminium nitride, boron nitride, alumina, magnesium oxide, magnesium hydroxide, titanium oxide, mica, Neuburger siliceous earth, organic bentonite, or zirconium phosphate. Any one type of the above-described examples of the filler can be used alone, or two or more types of the filler examples can be appropriately combined to be used.

The resin insulating substrate can be prepared by the following methods. For example, in one method, plural film-shape resin insulating layers 210 are layered and bonded to one another to form the resin insulating substrate. In another method, a liquid precursor resin is applied and hardened to form a resin insulating layer 210, on this resin insulating layer 210, another resin insulating layer 210 is formed by using the liquid precursor resin, and such a process is repeated to form the resin insulating substrate. The method of layering the film-shape resin insulating layers 210 is more efficient.

The joint conductors 221 and 223 and the internal conductor 222 of the second circuit conductor 220 may be formed, for example, as follows. First, a resist film having openings corresponding to the via conductor (a portion extending in the direction orthogonal to the substrate surface) and a thin-film wiring layer (a portion extending in the direction parallel to the substrate surface) of the internal conductor 222 is formed on a resin layer serving as the resin insulating layer 210, and a recessed portion corresponding to the thin-film wiring layer and a through hole corresponding to the via conductor are formed by etching or laser processing. Although such a recessed portion corresponding to the thin-film wiring layer is not necessarily required, the joining reliability between the thin-film wiring layer and the resin insulating layer 210 can be increased by the recessed portion being provided. Next, by a thin-film forming method such as a vapor deposition method, a sputtering method, or an ion plating method, an underlying conductor layer made of a chromium (Cr)-copper (Cu) alloy layer or a titanium (Ti)-copper (Cu) alloy layer, for example, is formed in each of the recessed portion and the through hole of the resin insulating layer 210. Next, by plating or other methods, the recessed portion and the through hole are filled with a metal, such as copper or gold, having a low electric resistance, and the resist is removed to form the internal conductor 222.

On the surface of the joint conductor 221 of the second circuit conductor 220, a nickel film of about 1 to 10 μm in thickness and a gold film of about 0.1 to 3 μm in thickness are formed in turn, and it is thereby possible to protect the surface of the joint conductor 221 and to improve the joining property of, for example, a brazing material and solder. Such a nickel film and gold film can be formed by using a plating film formed by electrolytic plating or a thin film.

Examples of a method of forming the heater substrate 100 and the circuit board 200 into a layered structure include a method in which the circuit board 200 that has been prepared in advance is bonded to the upper surface (the first surface 11) of the heater substrate 100 and a method in which the resin insulating layers 210 are layered, one by one, on the upper surface (the first surface 11) of the heater substrate 100. For the method in which the resin insulating layers 210 are layered one by one, there may be employed the above-described method using a film-shape resin or the above-described method using a liquid precursor resin. The method in which the circuit board 200 is prepared in advance, and the plural resin insulating layers 210 (and the second circuit conductors 220) are bonded at once to the upper surface (the first surface 11) of the heater substrate 100 is more efficient.

The probe pins 400 are attached to the second circuit conductors 220 (the joint conductors 221) of the probe card substrate 300 that has been prepared as described above, and the probe card 700 is thus formed. The probe pins 400 are mechanically joined to and simultaneously electrically connected to the joint conductors 221.

The probe pins 400 are made of a metal such as nickel or tungsten. When being made of nickel, the probe pins 400 are prepared, for example, as follows. First, female portions of plural probe pins are formed in a surface of a silicon substrate by etching. The female portions are arranged so as to correspond to the arrangement of the joint conductors 221 of the probe card substrate 300. Next, a metal of nickel is deposited, by plating, on the surface of the silicon substrate in which the female portions are formed, and the female portions are further filled with the nickel. Other than the part of the nickel with which the female portions are filled, the nickel deposited on the upper surface of the silicon substrate is removed by processing such as etching to prepare the silicon substrate in which such nickel probe pins are embedded. The nickel probe pins embedded in the silicon substrate are joined to the joint conductors 221 of the probe card substrate 300 by using a conductive joining material such as solder. The silicon substrate is then removed by using a potassium hydroxide aqueous solution, and the probe card 700 having the probe pins 400 being joined to the joint conductors 221 of the probe card substrate 300 is thus obtained.

Each of the embodiments of the present disclosure has so far been described. However, the heater substrate, the probe card substrate, and the probe card of the present disclosure are not limited to the above-described embodiments. For example, although the example of applying the heater substrate to the probe card substrate is given in the above-described embodiment, in addition thereto, the heater substrate may also be applied to various substrates that are required to be heated. In addition, the number of heating elements, the number and arrangement of adjustment sections, a section of a heating element in which an adjustment section is connected to the heating element, and a pattern of heater wire pieces in an adjustment section are merely examples and may be modified variously. For example, when, in the insulating substrate, a center portion or other various portions are positioned outside a region facing a heating target, an adjustment section may be disposed in any one of such portions. In addition, when there is a portion required to be heated at relatively high temperature, an adjustment section may be disposed at the portion. In addition thereto, the details given in the embodiments can appropriately be modified or combined without departing from the spirit of the present disclosure.

INDUSTRIAL APPLICABILITY

The present disclosure is applicable to a heater substrate, a probe card substrate, and a probe card.

REFERENCE SIGNS LIST 1 insulating substrate
1a ceramic insulating layer 2 first circuit conductor
3A to 3D heating element
4 feeding conductor
11 first surface
12 second surface
21 joint conductor
22 internal conductor
23 external terminal
31 heater wire piece
35, 36 adjustment section
42 internal conductor
43 feeding electrode
100 heater substrate
200 circuit board
201 third surface
202 fourth surface
210 resin insulating layer
220 second circuit conductor
221, 223 joint conductor
222 internal conductor
300 probe card substrate
400 probe pin
700 probe card
SW wafer
W1 region facing heating target

The invention claimed is:

1. A heater substrate comprising:
an insulating substrate having a first surface and a second surface on an opposite side relative to the first surface; and at least one heating element of spiral shape including a plurality of heater wire pieces and positioned in or on the insulating substrate,
wherein the heating element of spiral shape has
at least one adjustment section including a turn of all or some of the plurality of heater wire pieces,
wherein the plurality of heater wire pieces include
a first heater wire piece and
a second heater wire piece adjacent to an inner side of the first heater wire piece, and
wherein, in the adjustment section, a length of the first heater wire piece is smaller than a length of the second heater wire piece.

2. The heater substrate according to claim 1,
wherein the adjustment section is positioned in an outer circumferential portion of the heating element of spiral shape.

3. The heater substrate according to claim 1,
wherein the adjustment section is positioned in an end portion of the heating element of spiral shape.

4. The heater substrate according to claims 1, comprising a plurality of the adjustment sections included in one or a plurality of the heating elements,
wherein the plurality of the adjustment sections are dispersedly arranged in a circumferential direction.

5. The heater substrate according to claims 1,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

6. The heater substrate according to claims 1, further comprising a plurality of first circuit conductors positioned in a region from the first surface to the second surface and insulated from the heater wire pieces.

7. A probe card substrate comprising:
heater substrate according to claim 6; and
a circuit board positioned on the first surface of the heater substrate and having a plurality of second circuit conductors,
wherein the plurality of second circuit conductors are connected to the plurality of first circuit conductors.

8. A probe card comprising: the probe card substrate according to claim 7; and a plurality of probe pins connected to the plurality of second circuit conductors.

9. The heater substrate according to claim 2,
wherein the adjustment section is positioned in an end portion of the heating element of spiral shape.

10. The heater substrate according to claim 2, comprising a plurality of the adjustment sections included in one or a plurality of the heating elements,
wherein the plurality of the adjustment sections are dispersedly arranged in a circumferential direction.

11. The heater substrate according to claim 3, comprising a plurality of the adjustment sections included in one or a plurality of the heating elements,
wherein the plurality of the adjustment sections are dispersedly arranged in a circumferential direction.

12. The heater substrate according to claim 9, comprising a plurality of the adjustment sections included in one or a plurality of the heating elements,
wherein the plurality of the adjustment sections are dispersedly arranged in a circumferential direction.

13. The heater substrate according to claim 2,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

14. The heater substrate according to claim 3,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

15. The heater substrate according to claim 9,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

16. The heater substrate according to claim 4,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

17. The heater substrate according to claim 10,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

18. The heater substrate according to claim 11,
wherein the heating element of spiral shape is positioned inside the insulating substrate,
wherein the insulating substrate further has a feeding electrode positioned on the second surface, and wherein the feeding electrode is electrically connected to all or some of the plurality of heater wire pieces.

19. The heater substrate according to claim 12,
wherein the heating element of spiral shape is positioned inside the insulating substrate,
wherein the insulating substrate further has a feeding electrode positioned on the second surface, and
wherein the feeding electrode is electrically connected to all or some of the plurality of heater wire pieces.

* * * * *